(12) United States Patent
Cheung et al.

(10) Patent No.: US 12,007,811 B2
(45) Date of Patent: *Jun. 11, 2024

(54) CABLE RETRACTOR FOR ROTATABLE DOCKING STATION

(71) Applicant: Crestron Electronics, Inc., Rockleigh, NJ (US)

(72) Inventors: King Woo Cheung, New City, NY (US); Ningsheng Zhu, Whippany, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,595

(22) Filed: Jul. 19, 2023

(65) Prior Publication Data

US 2023/0359243 A1    Nov. 9, 2023

Related U.S. Application Data

(63) Continuation of application No. 17/575,273, filed on Jan. 13, 2022, now Pat. No. 11,829,201.

(51) Int. Cl.
*G06F 1/16*     (2006.01)
*H01R 13/62*    (2006.01)
*H05K 7/16*     (2006.01)

(52) U.S. Cl.
CPC .......... *G06F 1/1632* (2013.01); *H01R 13/62* (2013.01); *H05K 7/16* (2013.01)

(58) Field of Classification Search
None
See application file for complete search history.

(56) References Cited

U.S. PATENT DOCUMENTS

| | | | |
|---|---|---|---|
| 5,377,598 A | 1/1995 | Kirchner et al. |
| 6,231,020 B1 | 5/2001 | Willson |
| 7,481,170 B2 | 1/2009 | Sommerfield |
| 8,469,303 B2 | 6/2013 | Feldstein |
| 8,469,304 B2 | 6/2013 | Feldstein |
| 8,469,305 B2 | 6/2013 | Feldstein |
| 8,657,224 B2 | 2/2014 | Feldstein |

(Continued)

FOREIGN PATENT DOCUMENTS

| | | |
|---|---|---|
| EP | 2171338 A1 | 4/2010 |
| JP | 2006208834 | 8/2006 |

(Continued)

*Primary Examiner* — James Wu
*Assistant Examiner* — Christopher L Augustin
(74) *Attorney, Agent, or Firm* — Crestron Electronics, Inc.

(57) ABSTRACT

A cable retractor includes a frame having first and second frame ends, opposing frame walls between the frame ends, and a track extending along one of the frame walls. A block slides along the track. A single first pulley is coupled to the block and is rotatable about a first axis that moves together with the block, the first pulley being the sole pulley that is rotatable about the first axis. A spring spool is mounted at the first frame end. A spring has a coiled part wound around the spring spool and has a segment that extends away from the coiled part and is coupled to the block. A single second pulley is disposed at the second frame end and is rotatable about a fixed second axis, the second pulley being the sole pulley that is rotatable about the second axis.

4 Claims, 12 Drawing Sheets

(56) References Cited

U.S. PATENT DOCUMENTS

| | | |
|---|---|---|
| 8,698,617 B2 | 4/2014 | Henson |
| 8,740,127 B2 * | 6/2014 | Soper .................. B65H 75/368 |
| | | 242/388.9 |
| 9,056,744 B2 | 6/2015 | Feldstein |
| 9,475,673 B2 | 10/2016 | Feldstein |
| 9,599,276 B2 | 3/2017 | Grziwok |
| 9,805,564 B1 | 10/2017 | Berglund |
| 9,936,823 B2 | 4/2018 | Galant |
| 10,549,946 B2 | 2/2020 | Pedoeem et al. |
| 10,677,386 B2 | 6/2020 | Hoang |
| 10,766,736 B2 | 9/2020 | Replogle et al. |
| 10,772,223 B2 | 9/2020 | Pedoeem et al. |
| 11,214,462 B2 | 1/2022 | Pedoeem et al. |
| 2009/0255588 A1 | 10/2009 | Bors |
| 2009/0256048 A1 | 10/2009 | Fujikawa et al. |
| 2009/0321186 A1 | 12/2009 | Louchart |
| 2012/0037783 A1 | 2/2012 | Alexander |
| 2012/0193486 A1 | 8/2012 | Levin |
| 2013/0043369 A1 | 2/2013 | Wheeler |
| 2013/0301216 A1 | 11/2013 | Trinh |
| 2014/0048667 A1 | 2/2014 | Ziesen |
| 2015/0166299 A1 * | 6/2015 | Feldstein ........... B65H 75/4421 |
| | | 242/388.9 |
| 2015/0208826 A1 | 7/2015 | Yang |
| 2015/0327693 A1 | 11/2015 | Ballhatchet |
| 2019/0063666 A1 | 2/2019 | Hoang |
| 2021/0270410 A1 | 9/2021 | Horvath |

FOREIGN PATENT DOCUMENTS

| | | |
|---|---|---|
| JP | 5778871 | 9/2015 |
| KR | 101957480 | 3/2019 |
| TW | 201517765 | 5/2015 |

* cited by examiner

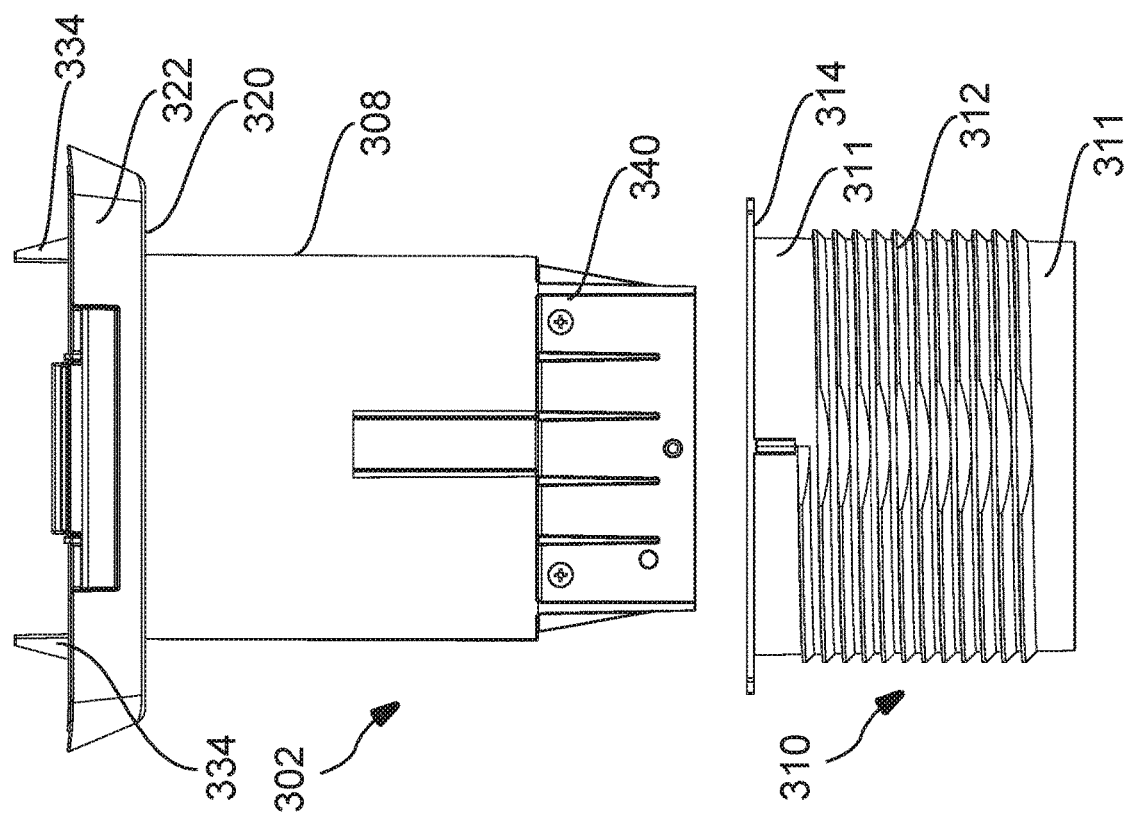
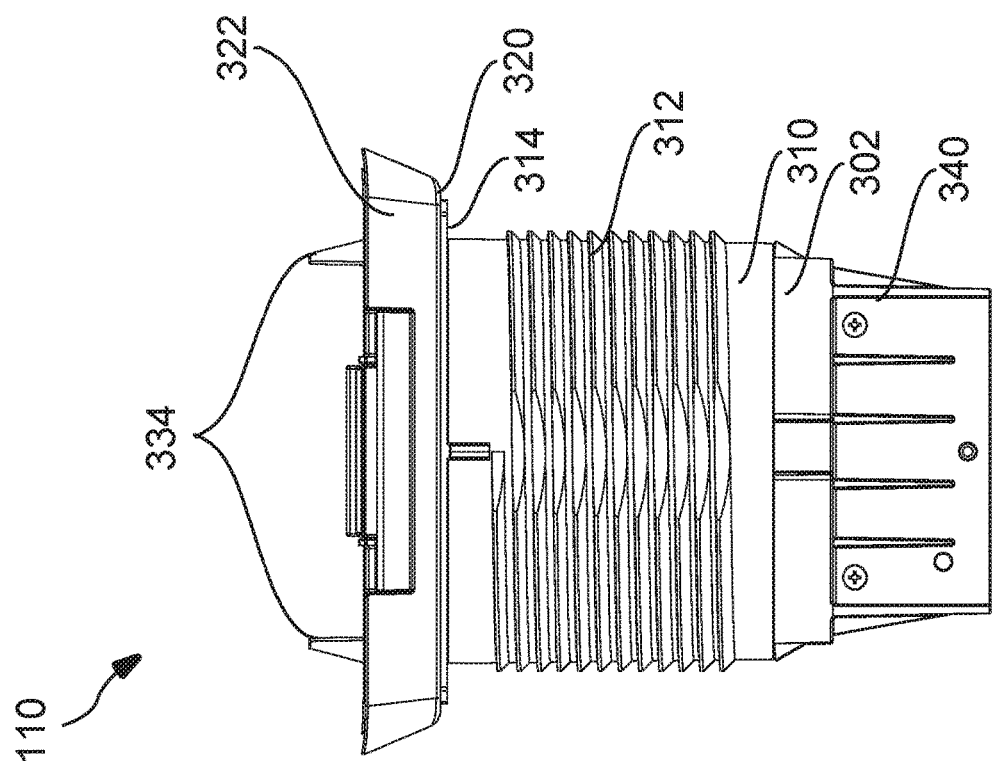
FIG. 4A
FIG. 4B

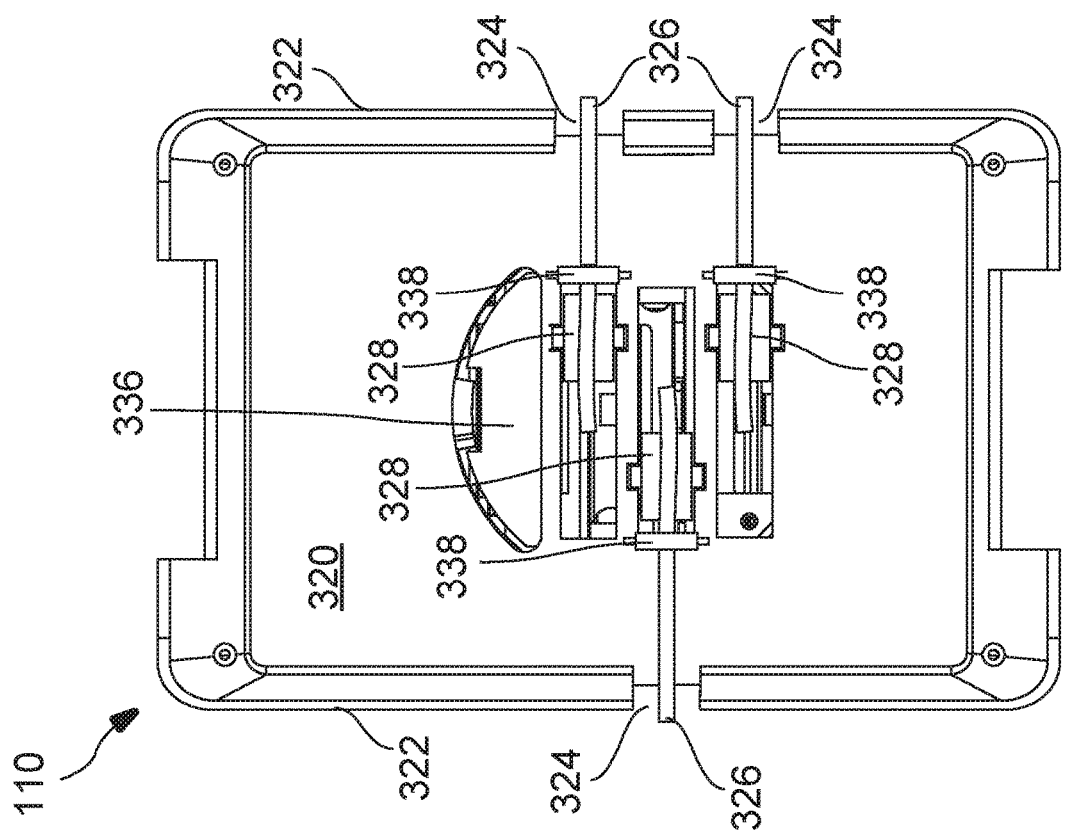
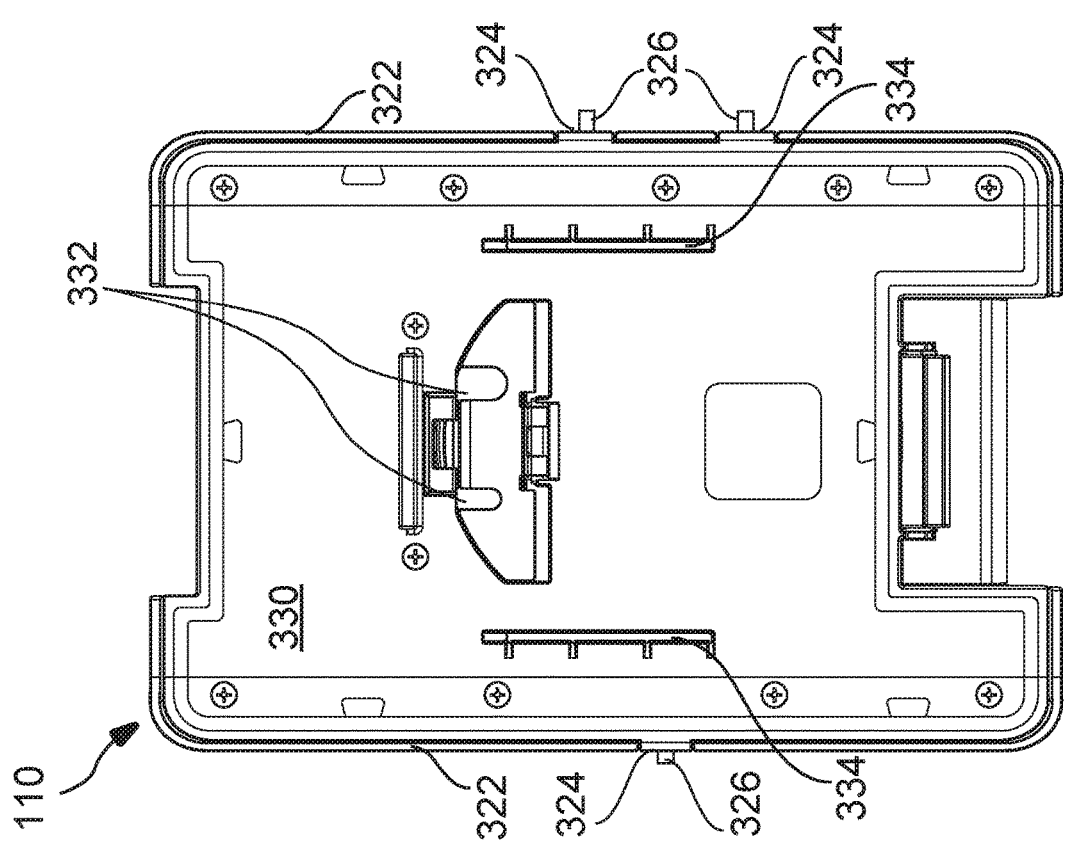
FIG. 5B
FIG. 5A

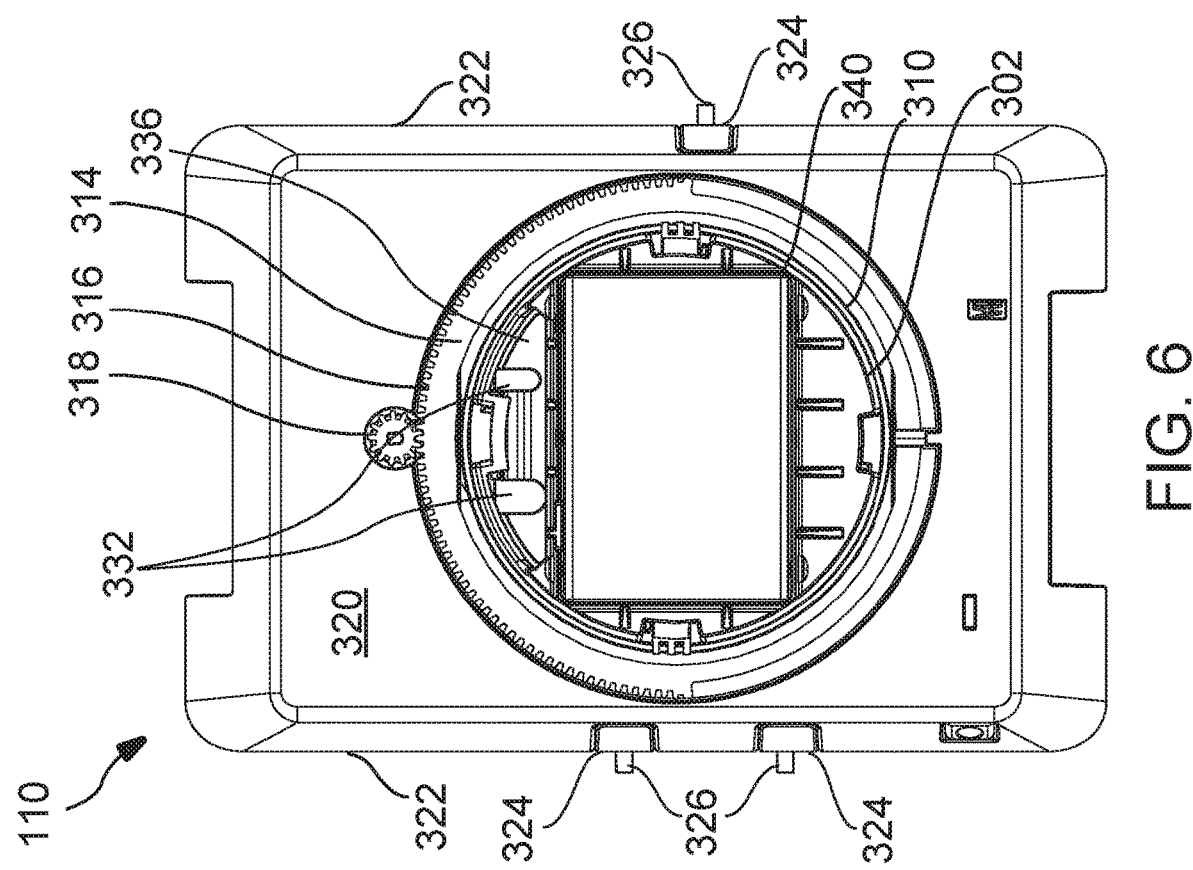

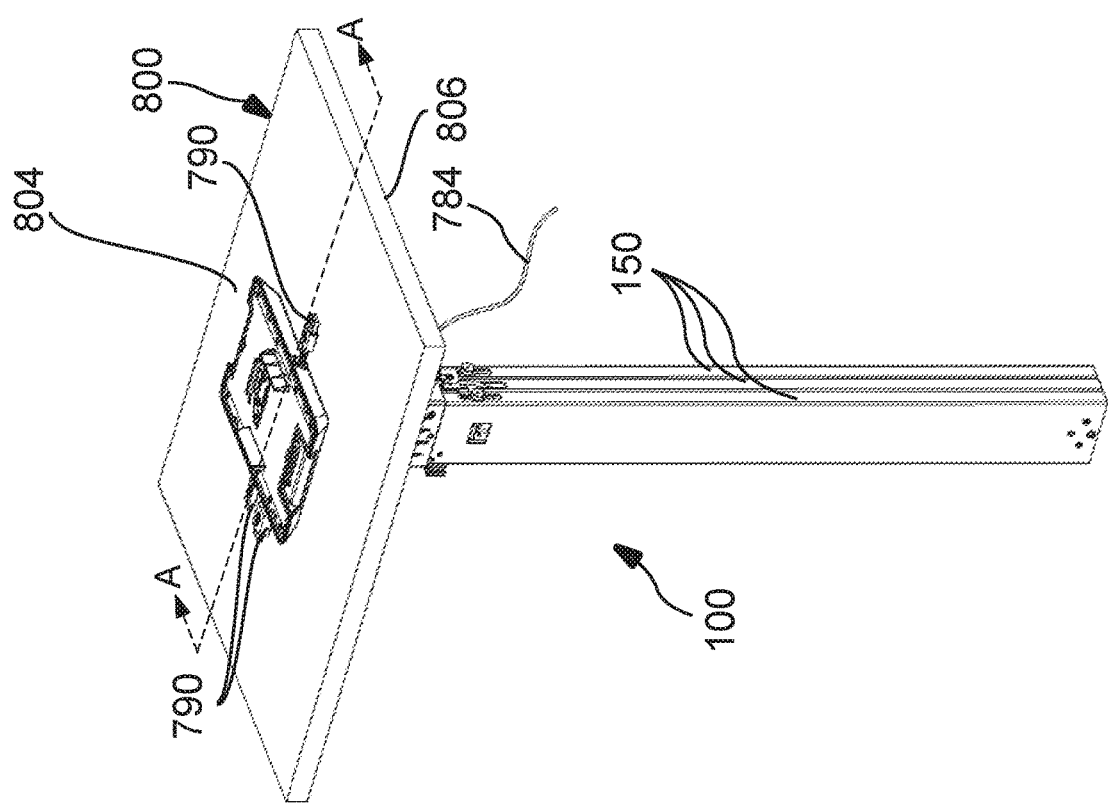
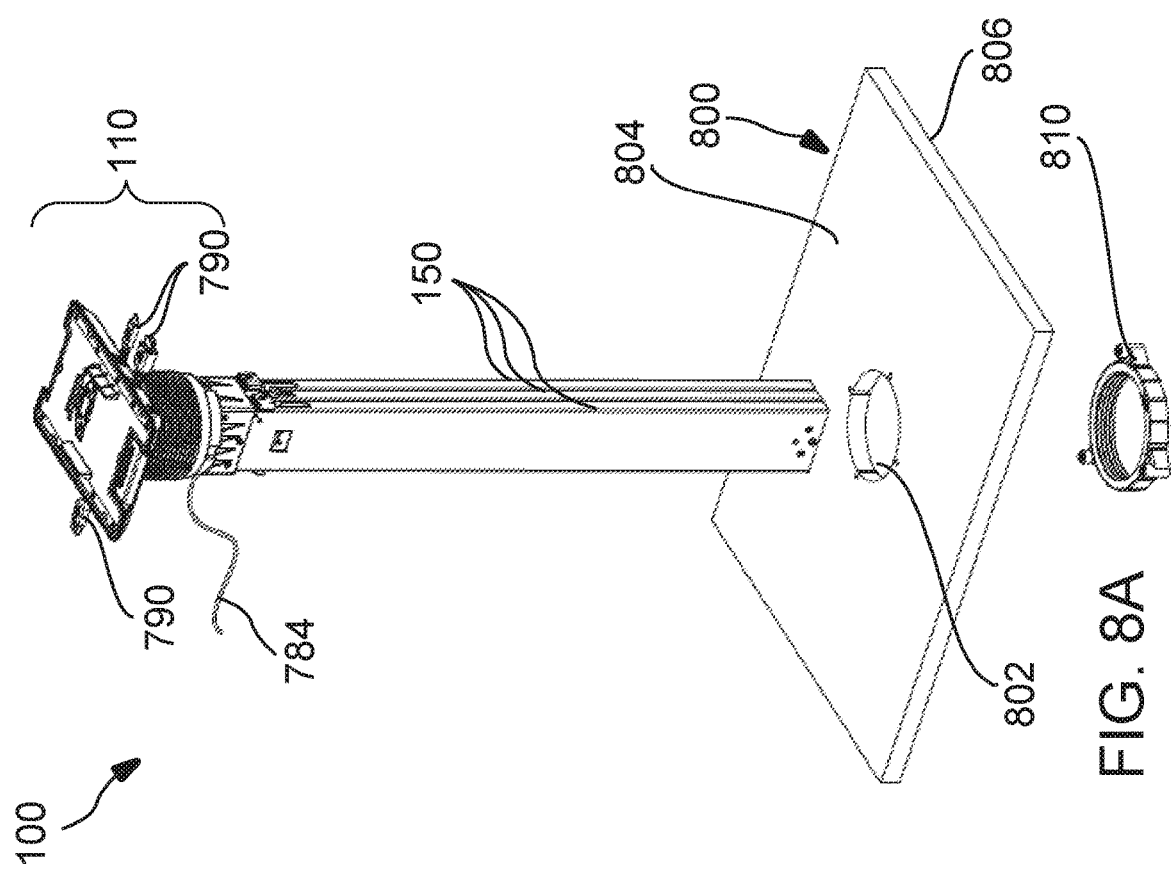
FIG. 8A
FIG. 8B

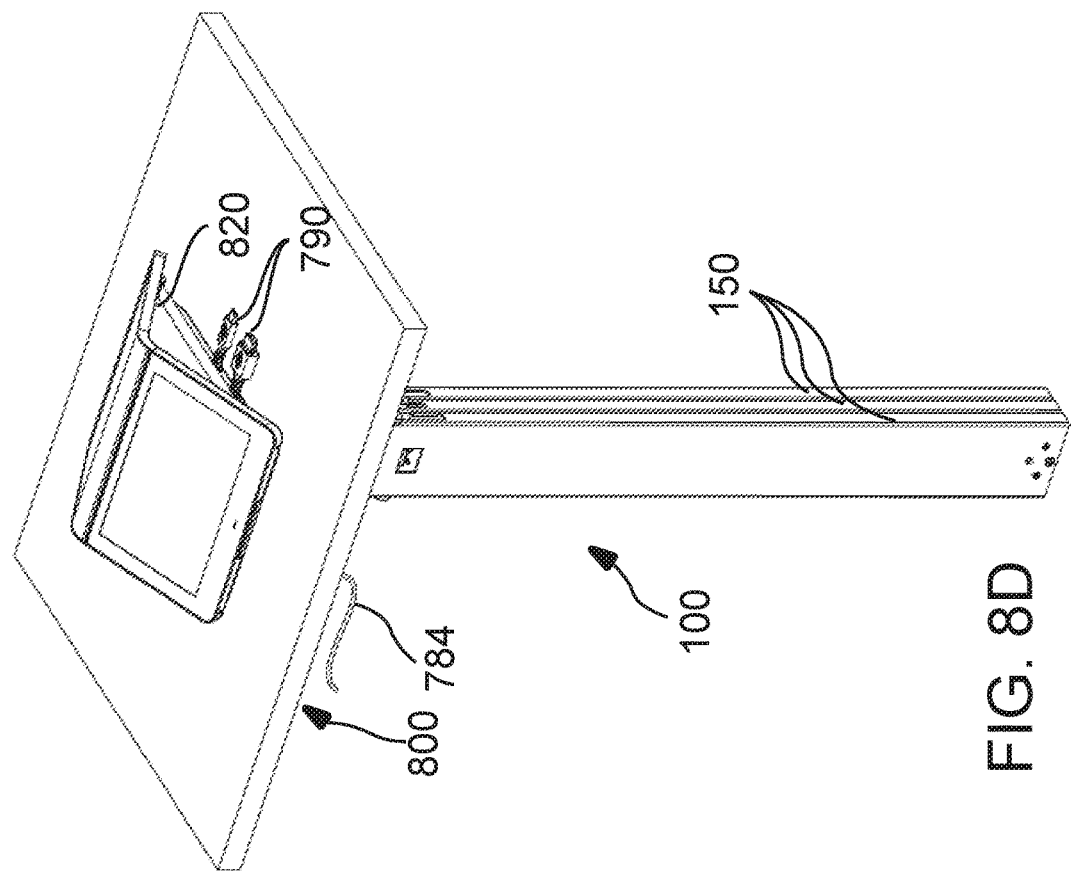
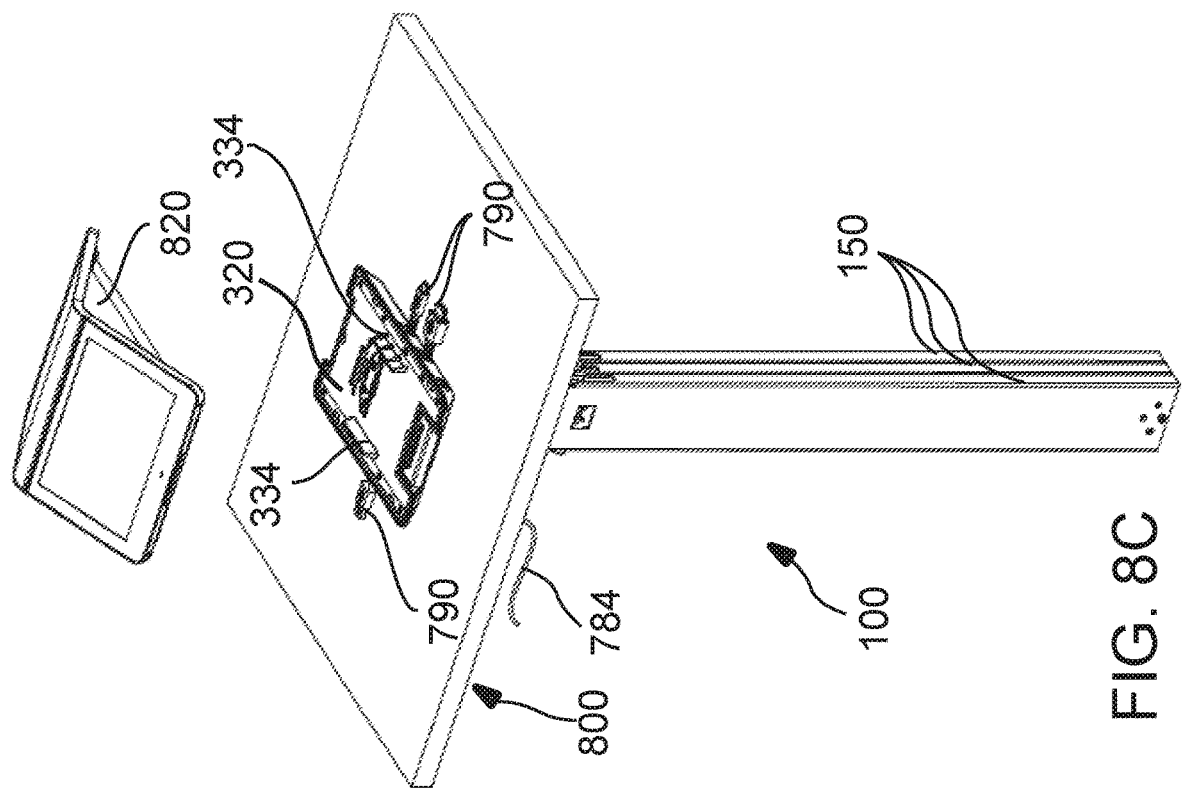
FIG. 8C
FIG. 8D

CABLE RETRACTOR FOR ROTATABLE DOCKING STATION

CROSS-REFERENCE TO RELATED APPLICATIONS

This application is a continuation of U.S. patent application Ser. No. 17/575,273, filed Jan. 13, 2022, the disclosure of which is incorporated herein by reference.

BACKGROUND OF THE INVENTION

Technical Field

The present embodiments relate to devices for rotatably mounting electronic devices atop a surface, such as a desk top or table top, and for providing power and data connections to the rotatably mounted electronic devices. The present embodiments also relate to devices for storing, withdrawing, and retracting cables in conjunction with devices for rotatably mounting electronic devices.

Background Art

In many applications, it is desirable to provide electronic devices that permit the control of audio, video, conferencing, and other functions by plural people within a common area, such as in a conference room. To enable each person to access the electronic device, the electronic device may be disposed atop a surface that is available to each of these participants, such as atop a table top of desk top. To use the electronic device, a person in the conference room or other common area preferably faces, for example, a screen and/or keypad of the electronic device. When another person in the room desires access to the device, the prior user may need to switch seats or spots with the new user, which may be disruptive to the flow of a conference or meeting. Alternatively, the electronic device may be physically moved along the table top from the location of one user to that of another user, which is also disruptive and may inadvertently cause one or more of the cables connected to the electronic device to be disconnected.

It is therefore desirable to provide a docking station or mounting assembly that supports such electronic devices in a manner that permits the electronic device surface to be turned from one user to another while minimizing disruption and minimizing the risk of the disconnection of cables.

In many such applications, it is further desirable for the docking station or mounting assembly to provide additional power and data connections to different electrical or electronic devices in the conference room or other common area using cables which may be dispensed when needed and then withdrawn out of sight when no longer needed.

It is therefore desirable to provide cable retractors that are suitable for attachment to, and for use in conjunction with, such a mounting or docking station.

SUMMARY OF THE INVENTION

It is to be understood that both the general and detailed descriptions that follow are exemplary and explanatory only and are not restrictive.

DISCLOSURE OF INVENTION

In accordance with an aspect, a swivel mount assembly for rotational mounting of an electronic device to a mounting structure, the swivel mount assembly comprises: (a) an assembly body, comprising: (1) an insertable part configured to be inserted into an opening in the mounting structure, the opening extending from a first surface of the mounting structure to an opposing second surface of the mounting structure, the insertable part having a shape that conforms to a shape of the opening, (2) a lip part attached to an end of the insertable part and being wider than the opening in the mounting structure such that the lip rests on the first surface upon the insertable part being inserted into the opening; (b) a securing body configured to secure the assembly body to the mounting structure; and (c) a rotatable body configured to be rotatable about an axis extending through the opening in the mounting structure, the rotatable body comprising: (1) another insertable part configured to be inserted into an opening in the insertable part of the assembly body, (2) a plate part attached to an end of the another insertable part such that the plate part is adjacent to the lip part of the assembly body upon the another insertable part being inserted into the opening in the assembly body, the plate part having at least one aperture formed therein, (3) a plurality of sidewalls each joined at one end to the plate part, at least one of the sidewalls having at least one side aperture formed therein, and (4) a platform part disposed at an opposing end of each of the plurality of sidewalls and being configured to support the electronic device, the platform part having at least one aperture formed therein, the at least one aperture in the plate part and the at least one aperture in the platform part being disposed at respective locations that permit a cable extending from the electronic device to pass through each.

According to another aspect, a rotatable docking station, comprises: (a) a swivel mount assembly for rotational mounting of an electronic device to a mounting structure, the swivel mount assembly comprising: (1) an assembly body, comprising: (A) an insertable part configured to be inserted into a circular opening in the mounting structure, the opening extending from a first surface of the mounting structure to an opposing second surface of the mounting structure, the insertable part being a cylindrical tube, and an outer surface of the insertable part of the assembly body being threaded, (B) a lip part attached to an end of the insertable part and being wider than the opening in the mounting structure such that the lip rests on the first surface upon the insertable part being inserted into the opening, (2) a securing body configured to secure the assembly body to the mounting structure, the securing body including a ring part that is threaded on its inside such that the ring part is rotatable along the threaded outer surface of the insertable part of the assembly body until the ring part contacts the second surface of the mounting structure and secures the lip of the insertable part of the assembly body against the first surface of the mounting structure, (3) a rotatable body configured to be rotatable about an axis extending through the opening in the mounting structure, the rotatable body comprising: (A) another insertable part configured to be inserted into an opening in the insertable part of the assembly body, the another insertable part of the rotatable body being a further cylindrical tube having an opening therein that extends from the end of the another insertable part to an opposing end of the another insertable part, (B) a plate part attached to the end of the another insertable part such that the plate part is adjacent to the lip part of the assembly body upon the another insertable part being inserted into the opening in the assembly body, the opening in the cylindrical tube further extending through a region of the plate part, the plate part having at least one aperture formed in another region of the plate part, (C) a plurality of sidewalls each joined at one end to the plate part, at least one of the sidewalls having at least one side aperture formed therein, and (D) at least one roller disposed within the opening in the cylindrical tube, and (4) a platform part disposed at an opposing end of each of the plurality of sidewalls and being configured to support the electronic device, the platform part having at least one aperture formed therein, the at least one aperture in the plate part and the at least one aperture in the platform part being disposed at respective locations that permit a cable extending from the electronic device to pass through each; and (b) at least one cable retractor coupled to another end of the another insertable part of the rotatable body, and comprising: (1) a frame having first and second frame ends, opposing first and second frame walls disposed between the first and second frame ends, and a track extending along one of the first and second frame walls, (2) a slideable block disposed in, and configured to slide along, the track, (3) a first pulley coupled to the slideable block and rotatable about a first axis that moves together with the slidable block, (4) at least one spring spool mounted at the first frame end, (5) a spring having a coiled part wound around the at least one spring spool, and having a segment that extends away from the coiled part and is coupled to the slideable block, and (6) a second pulley disposed at the second frame end and rotatable about a fixed second axis, (c) wherein (1) an intermediate storage section of a further cable is ordinarily disposed within the frame of the at least one retractor and wound around at least part of each of the first and second pulleys, (2) a first end of the intermediate storage section extends through a first opening located in one of the first and second frame walls, and (3) a second end of the intermediate storage section extends through a second opening located at the second frame end and through the further cylindrical tube of the another insertable part, the at least one roller being configured to direct the second end of the intermediate storage section to further pass through the at least one side aperture of the at least one of the sidewalls, (4) in response to the second end of the intermediate storage section of the cable being pulled away from the at least one aperture in the at least one of the sidewalls of the rotatable body, the first pulley and the slideable block are urged away from the first frame end toward the second frame end thereby permitting a portion of the intermediate storage section of the cable to be withdrawn from the rotatable docking station.

According to a further aspect, a cable retractor, comprises: (a) a frame having first and second frame ends, opposing first and second frame walls disposed between the first and second frame ends, and a track extending along one of the first and second frame walls; (b) a slideable block configured to slide along the track; (c) a single first pulley coupled to the slideable block and rotatable about a first axis that moves together with the slidable block; (d) at least one spring spool mounted at the first frame end; (e) a spring having a coiled part wound around the at least one spring spool, and having a segment that extends away from the coiled part and is coupled to the slideable block; and (f) a single second pulley disposed at the second frame end and rotatable about a fixed second axis; (g) wherein (1) an intermediate storage section of a cable is ordinarily disposed within the frame, a first end of the intermediate storage section extending through a first opening located in one of the first and second frame walls, and a second end of the intermediate storage section extending through a second opening located at the second frame end, (2) the intermediate storage section of the cable extends from the first end the intermediate storage section of the cable to the first pulley, then around the at least part of the first pulley, then from the first pulley to the second pulley, then around the at least part of the second pulley, and then from the second pulley to the second end of the intermediate storage section of the cable, (3) in response to the second end of the intermediate storage section of the cable being pulled away from the frame, the first pulley and the slideable block are urged away from the first frame end toward the second frame end thereby permitting a portion of the intermediate storage section of the cable to be withdrawn from the frame.

BRIEF DESCRIPTION OF DRAWINGS

The accompanying figures further illustrate the present embodiments.

The components in the drawings are not necessarily drawn to scale, emphasis instead being placed upon clearly illustrating the principles of the present embodiments. In the drawings, like reference numerals designate corresponding parts throughout the several views.

BRIEF DESCRIPTION OF THE SEVERAL VIEWS OF THE DRAWING

Figure 1A:
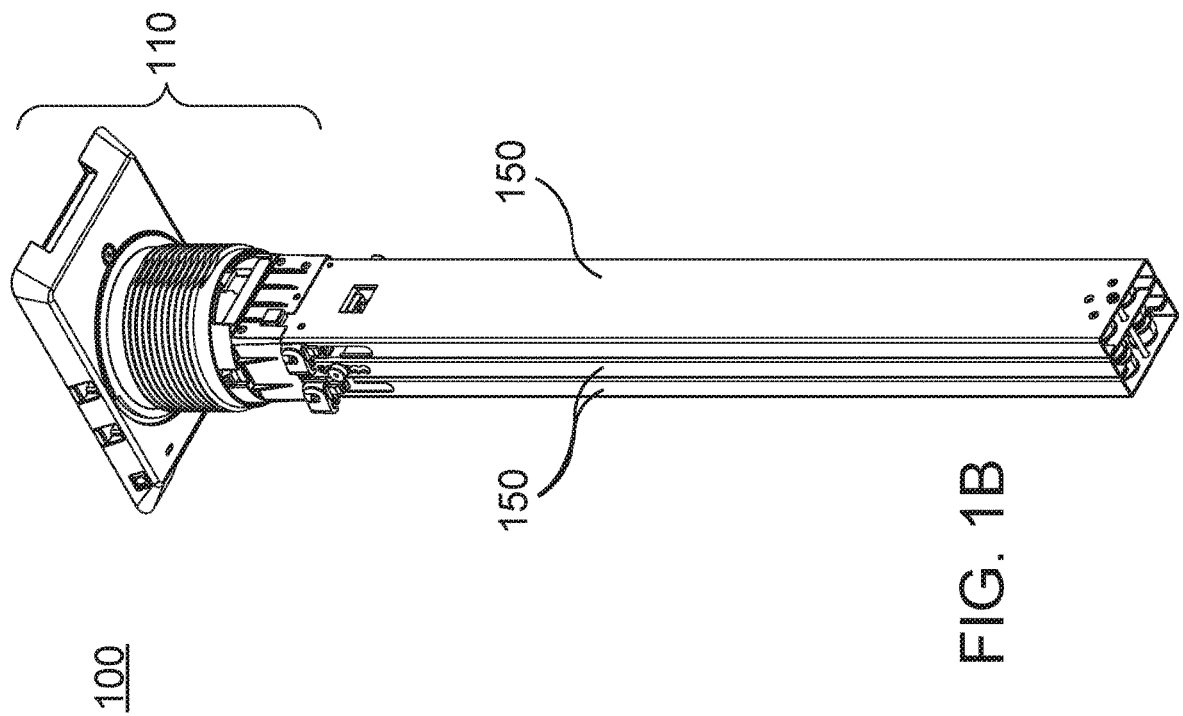
Figure 1B:
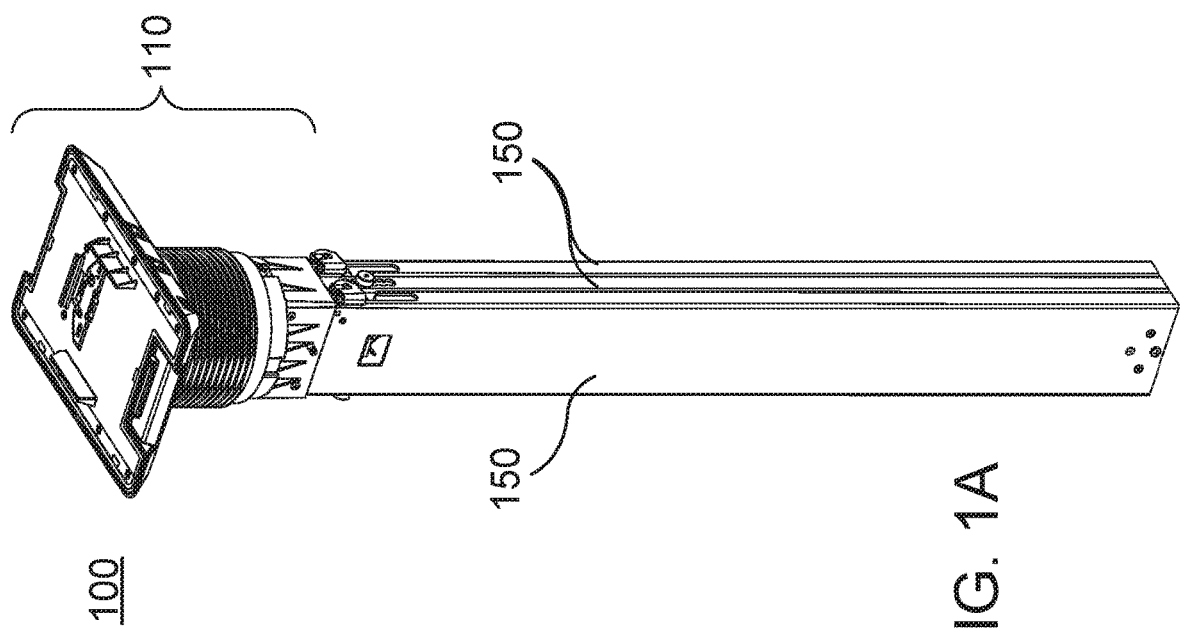

FIGS. 1A and 1B are top and bottom perspective views, respectively, of a rotatable docking station with three retractors attached in accordance with an embodiment.

Figure 2B:
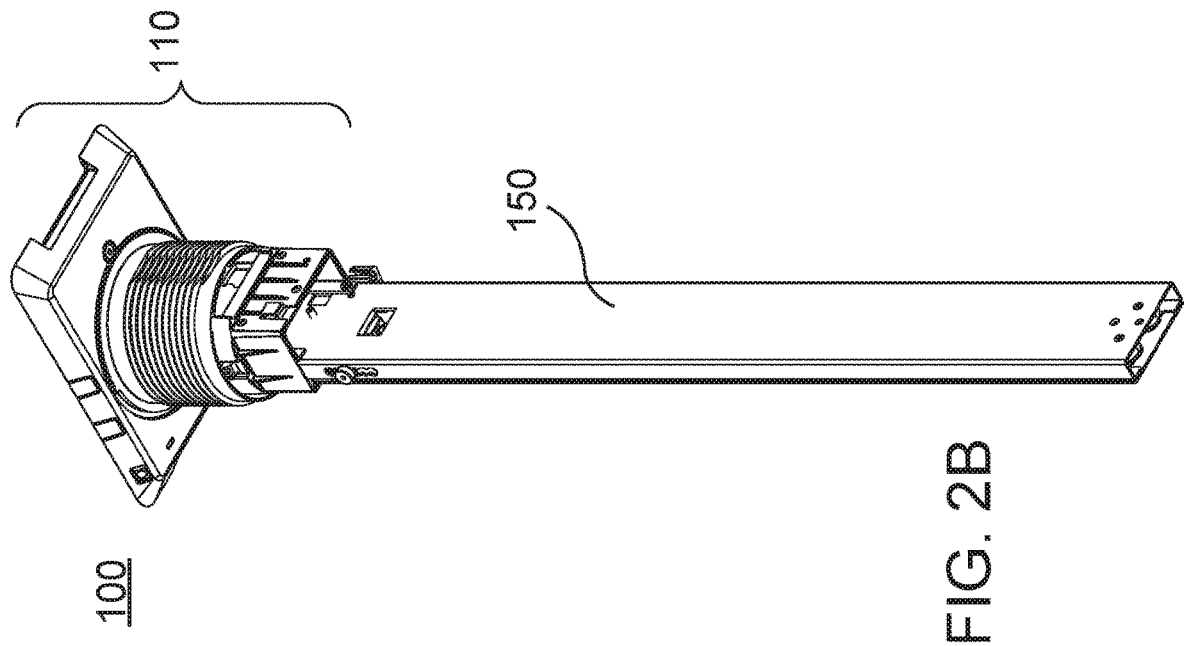
Figure 2A:
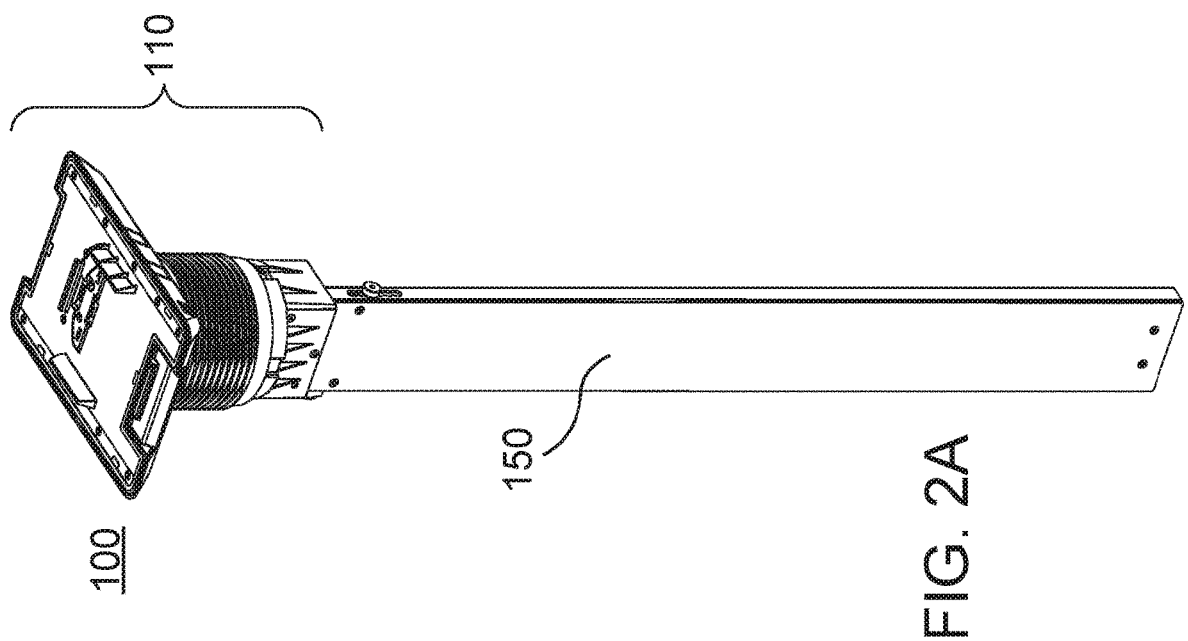

FIGS. 2A and 2B are top and bottom perspective views, respectively, of a rotatable docking station with a single retractor attached in accordance with an embodiment.

Figure 3B:
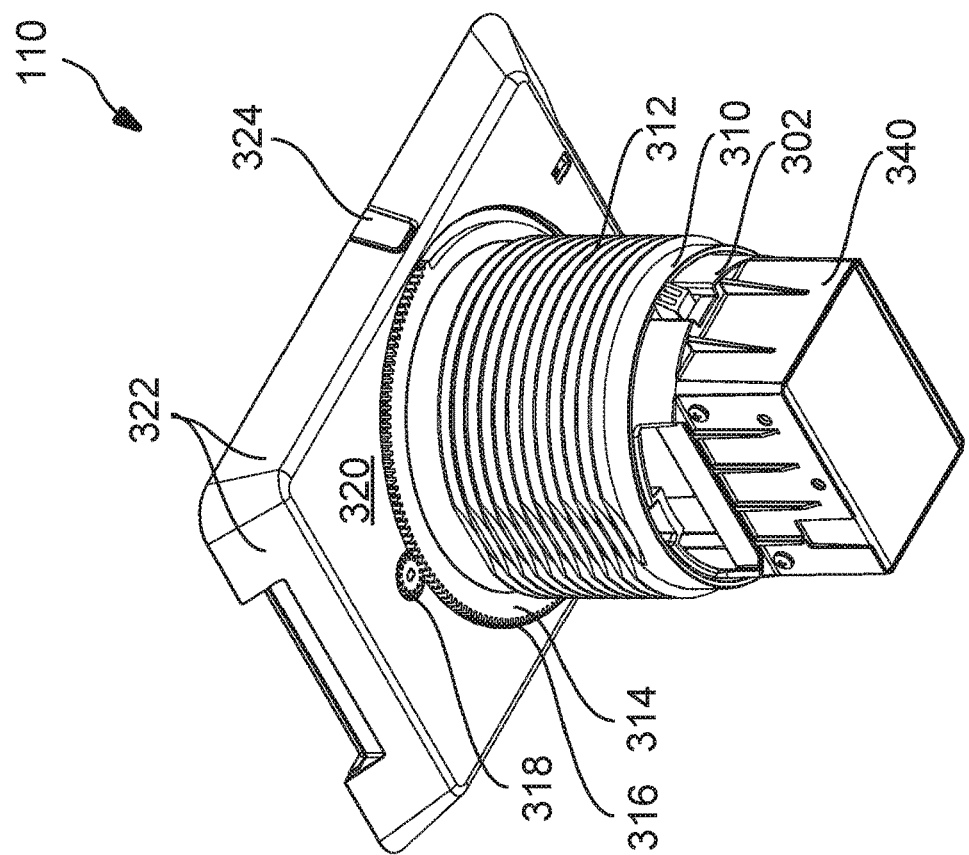
Figure 3A:
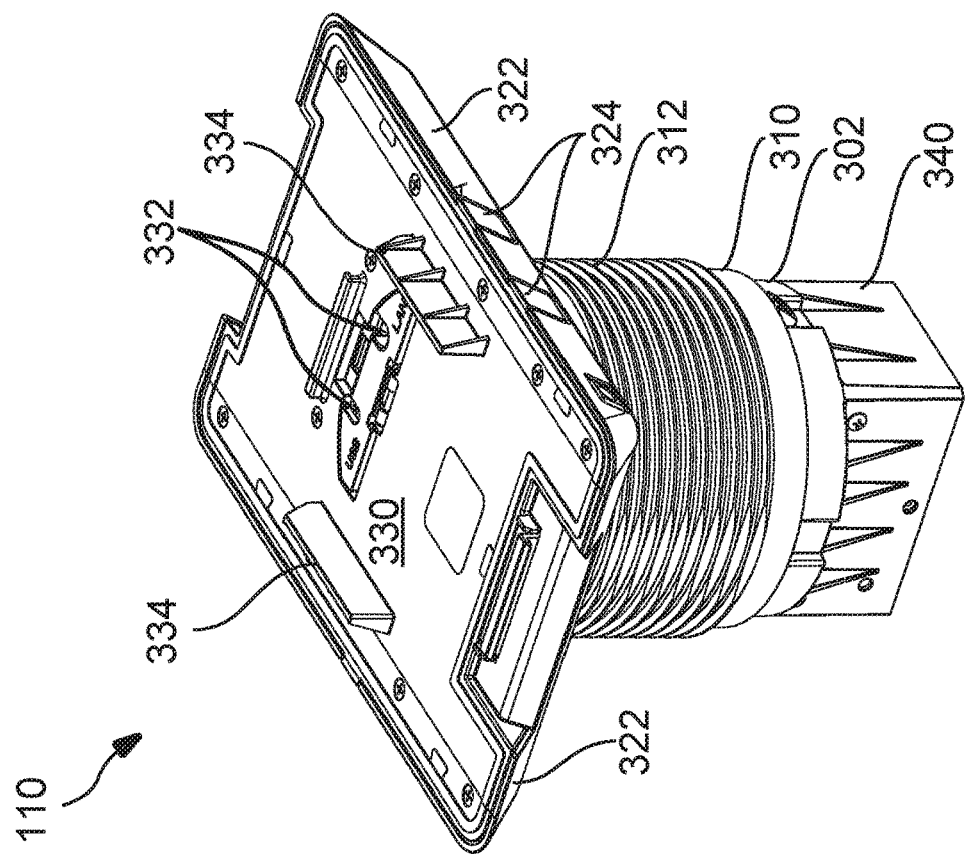

FIGS. 3A and 3B are a close-up top and bottom perspective views, respectively, of the swivel mount assembly shown in FIGS. 1A-1B and 2A-2B.

FIG. 4A is a close-up side elevation view of the swivel mount assembly shown in FIGS. 3A-3B.

FIG. 4B is a close-up side elevation view of the swivel mount assembly shown in FIG. 4A showing the rotatable body removed from the assembly body in accordance with an embodiment.

FIG. 5A is a top plan view of the swivel mount assembly shown in FIGS. 4A-4B.

FIG. 5B is a top plan view of the swivel mount assembly shown in FIGS. 4A-4B with the platform part removed.

FIG. 6 is a bottom plan view of the swivel mount assembly shown in FIGS. 4A-4B.

Figure 7A:
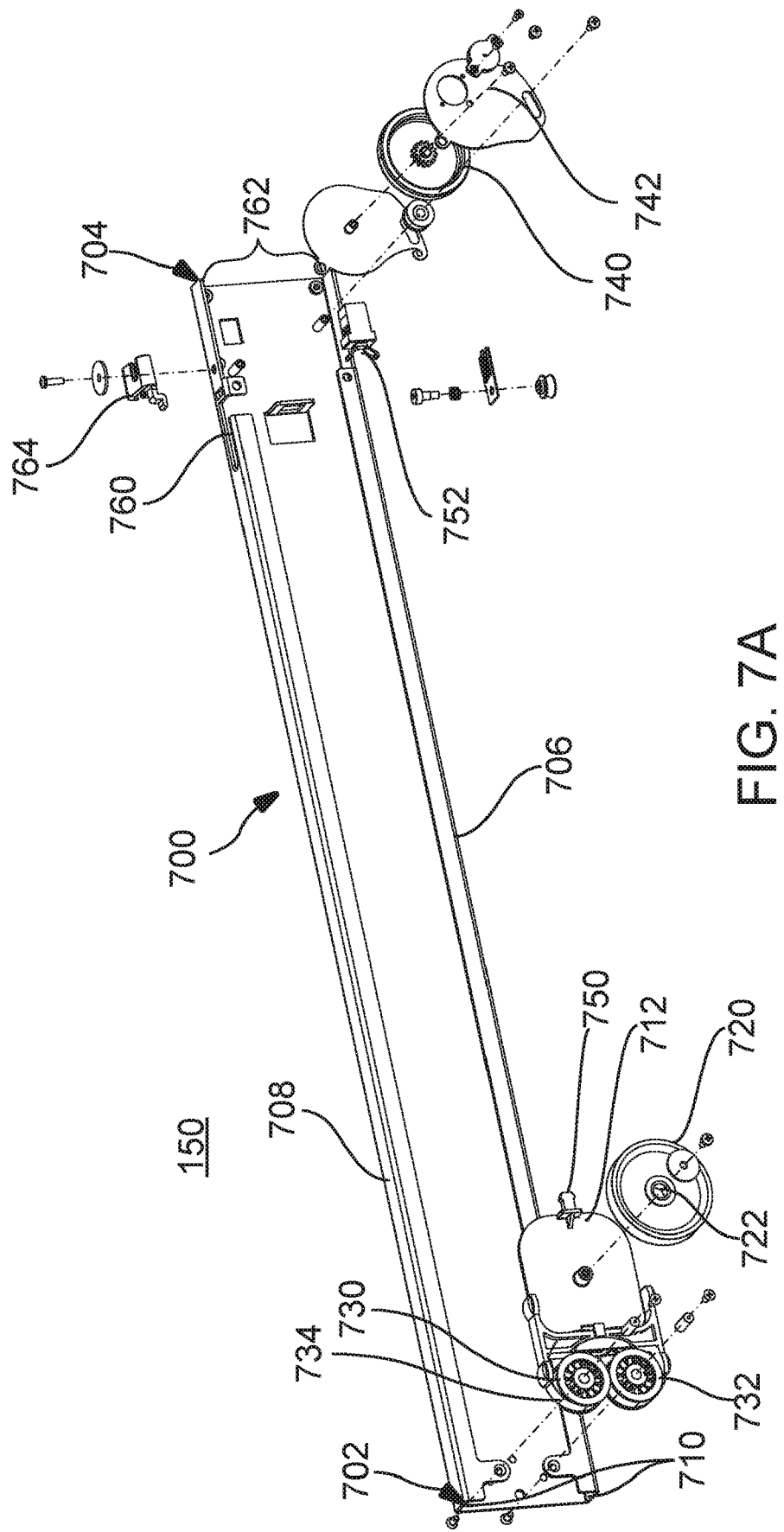

FIG. 7A is an exploded view of one of the retractors shown in FIGS. 1A-1B and 2A-2B in accordance with an embodiment.

Figure 7B:
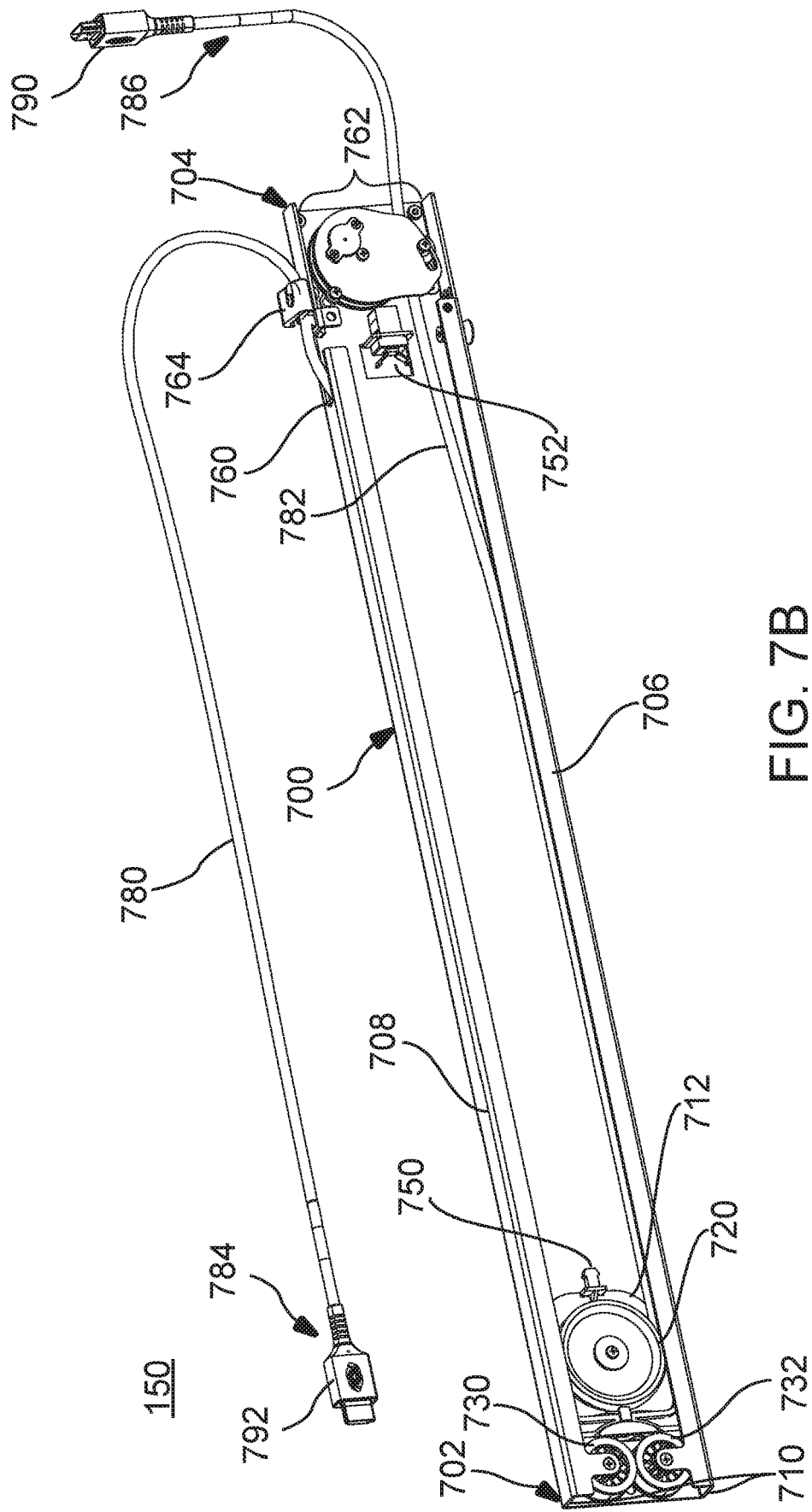

FIG. 7B is a side perspective view of the retractor shown in FIG. 7A with a side panel removed.

Figure 7C:
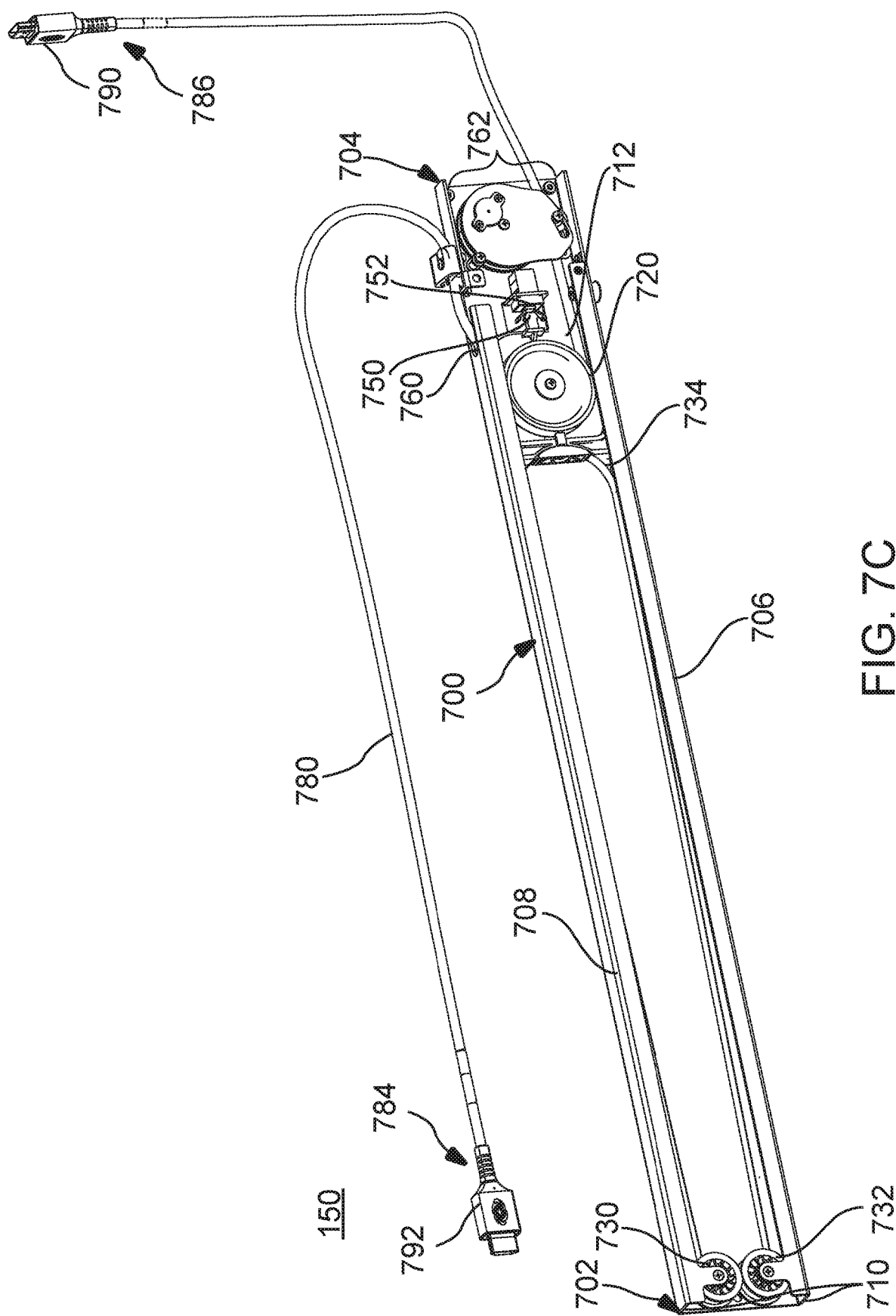

FIG. 7C is a side perspective view of the retractor shown in FIG. 7A with a side panel removed and the cable fully withdrawn from the retractor.

FIGS. 8A-8E are top perspective views showing the mounting of the rotatable docking station with retractors in an opening in a surface in accordance with an embodiment.

Figure 9:
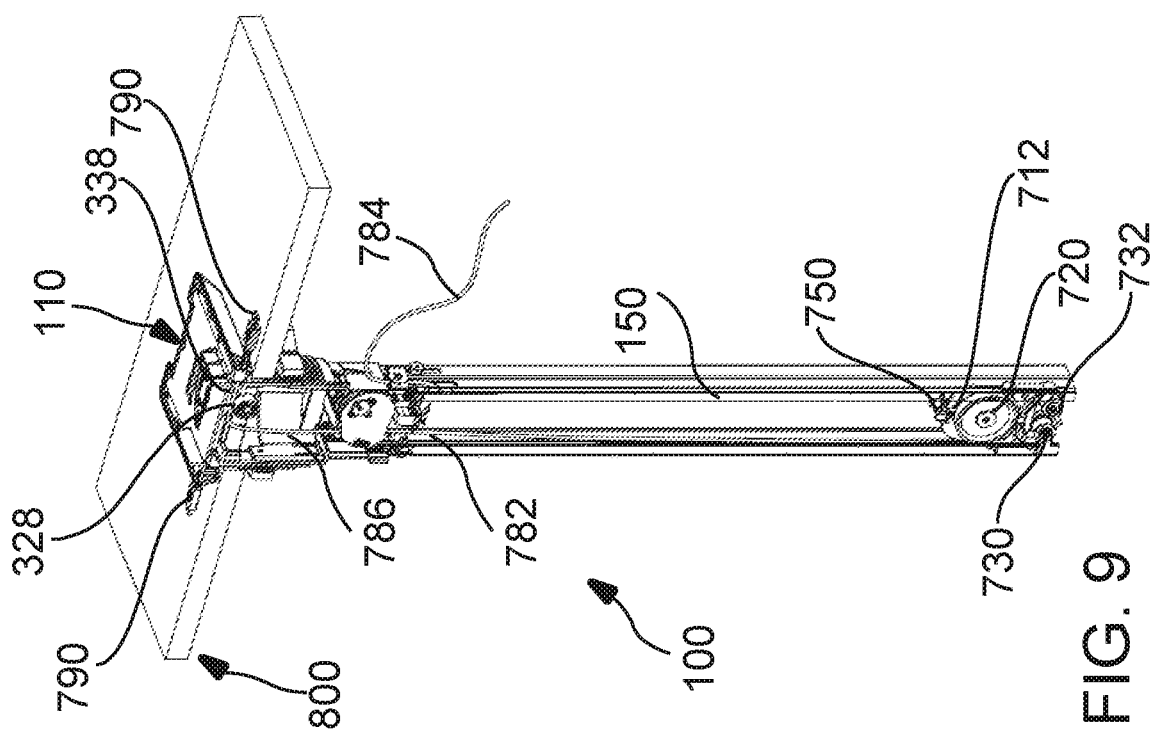

FIG. 9 is a cross-sectional view of the mounted rotatable docking station with retractors shown in FIG. 8B taken along line A-A.

DETAILED DESCRIPTION OF THE INVENTION

The present embodiments provide a rotatable docking station for rotatably supporting electronic devices and providing rotatable electrical and data connections to the electronic device while also providing additional retractable electrical and data connections for other devices.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

LIST OF REFERENCE NUMBERS FOR THE MAJOR ELEMENTS IN THE DRAWING

The following is a list of the major elements in the drawings in numerical order.
- 100 Rotatable Docking Station With Cable Retractors
- 110 Swivel Mount Assembly
- 150 Cable Retractor
- 302 Rotatable Body
- 308 Cylindrical Region of Rotatable Body
- 310 Insertable Part
- 311 Cylindrical Region of Insertable Part
- 312 Threads
- 314 Lip Part
- 316 Lip Part Gear Teeth
- 318 Circular Gear
- 320 Plate Part
- 322 Side Walls
- 324 Side Wall Apertures
- 326 Cables
- 328 First Roller
- 330 Platform Part
- 332 Platform Part Apertures
- 334 Extensions
- 336 Plate Part Aperture
- 338 Second Roller
- 340 End Portion
- 700 Retractor Frame
- 702 First Frame End
- 704 Second Frame End
- 706 First Frame Wall
- 708 Second Frame Wall
- 710 Track
- 712 Slideable Block
- 720 Single First Pulley
- 722 First Axis
- 730 First Spring Spool
- 732 Second Spring Spool
- 734 Spring
- 740 Single Second Pulley
- 750 Staple Catch
- 752 Latch Part
- 760 First Opening
- 762 Second Opening
- 764 Clip/Clamp
- 780 Cable
- 782 Intermediate Storage Section of Cable
- 784 First End of Cable
- 786 Second End of Cable
- 790 Free Connectors
- 792 Hidden Connectors
- 800 Mounting Structure
- 802 Mounting Structure Opening
- 804 First Surface
- 806 Second Surface
- 810 Threaded Securing Body
- 820 Electronic Device

MODE(S) FOR CARRYING OUT THE INVENTION

The embodiment described herein in the context of a rotatable docking station with cable retractors, but is not limited thereto, except as may be set forth expressly in the appended claims.

Referring first to FIGS. 1A and 1B, a rotatable docking station 100 is shown in accordance with an embodiment. FIG. 1A illustrates a top perspective view of the rotatable docking station 100 and FIG. 1B shows a bottom perspective view of the rotatable docking station 100.

The rotatable docking station 100 includes a swivel mount assembly 110, according to an embodiment. One or more cable retractors 150 are also included according to an embodiment. In FIGS. 1A and 1B, three such cable retractors 150 are provided. Alternatively, only one or two cable retractors 150 may be provided. For example, FIGS. 2A and 2B show top and bottom perspective views, respectively, of the rotatable docking station 100 in which only one cable retractor 150 is provided.

FIGS. 3A-3B, 4A-4B, 5A-5B and 6 show in greater detail the swivel mount assembly 110 depicted in FIGS. 1A-1B and 2A-2B. FIG. 3A illustrates a top perspective view of the swivel mount assembly 110, and FIG. 3B shows a bottom perspective view of the swivel mount assembly 110. FIGS. 4A-4B show side views of the swivel mount assembly 110. FIGS. 5A-5B show top plan views of the swivel mount assembly 110, and FIG. 6 shows a bottom plan view of the swivel mount assembly 110.

The swivel mount assembly 110 includes a rotatable body 302 and an insertable part 310 shown assembled in, e.g., FIG. 4A, and shown disassembled in FIG. 4B. The insertable part 310 is configured to be inserted at one end into an opening in a surface of a table top, desk top, or other structure. Typically, the opening extends completely through the table top, desk top, or other structure, and the insertable part 310 typically has a shape that corresponds to the shape of the opening to permit the insertable part 310 to fit into the opening. According to an embodiment, the insertable part 310 may be cylindrical-shaped for insertion into a corresponding circular opening and includes a cylindrical portion 311. For example, FIG. 8A shows a mounting structure 800, which may be a portion of the table top, desk top, or other structure, having a circular opening 802 into which the cylindrical portion 311 is inserted.

Referring back to FIGS. 4A-4B, a lip part 314 is located at one end of the end of the cylindrical portion 311 and may be integral with or coupled to the cylindrical portion 311. The lip part 314 is typically wider than the opening in the mounting structure so that the lip part 304 rests on a surface of the mounting structure after the insertable part is inserted into the opening. For example, the lip part 304 is suitable to rest on a first surface 804 of the mounting structure 800 shown in FIG. 8A.

Referring again back to FIGS. 4A-4B, the outer surface of the cylindrical portion 311 typically includes threads 312 over which, for example, a ring-shaped securing body that has compatible threads may be turned. For example, FIG. 8A shows a threaded securing body 810 that has threads compatible with the threads 312. After the insertable part 310 is inserted into an opening and the lip part 304 rests upon a first surface 804 of the mounting structure 800, the threaded securing body 810 may be turned along the threads 312 until it is secured against a second surface 806 of the mounting structure 800 and secures the lip part 304 to the first surface of 804.

Returning again to FIGS. 4A-4B, the swivel mount assembly 110 also includes a rotatable body 302 that is configured to be inserted into an opening in the cylindrical portion 311 of the insertable part 310. The rotatable body 302 includes a cylindrical portion 308 having an outer surface that is configured to be rotatable in the opening in the cylindrical portion 311.

The rotatable body 302 includes, at one end of the cylindrical portion 308, a plate part 320 that is integral with, or coupled to, the cylindrical portion 308. At an opposing end of the cylindrical portion 308, an end portion 340 is attached to which one, two or three retractors may be coupled. A plurality of side walls 322 extend away from, and may be integral with, the plate part 320. One or more side wall apertures 324 are provided in at least one of the side walls and provide openings through which a free end of a retractor cable passes. Each side wall aperture 324 is typically wider than the width of one of the retractor cables but is narrower than a connector disposed at the free end of the cable to prevent the connector from being drawn into the swivel mount assembly 110 and the retractor 150 when the cable is retracted.

FIG. 5A shows a top view of the swivel mount assembly 110. A platform part 330 is disposed at the ends of the sidewalls and covers the opening in the rotatable body 302. One or more platform part apertures 332 may be formed in the platform part 330 to permit cable from the electronic device to pass through. Extensions 334 that extend from the platform part 330 may also be provided to permit the electronic device to be attached to the platform part 330.

FIG. 5B shows a top view of the swivel mount assembly 110 with the platform part 330 removed. A pair of rollers 328, 338 reduce the friction on a cable 326 while the cable is being withdrawn from the retractor 150 and the swivel mount assembly 110 and while the cable 326 is being retracted into the retractor 150. The cable 326 passes upward from the retractor 150 and through the opening within the cylindrical region 311 of the insertable part 310, and then passes over a first roller 328 and under a second roller 338 before exiting the swivel mount assembly 110 through the side wall aperture 324.

A plate part aperture 336 is disposed below the one or more platform part apertures 332 formed in the platform part 330 and, together with the one or more platform part apertures 332, permit cables from the electronic device to pass through the swivel mount assembly 110 to the opening within the cylindrical region 311 of the insertable part 310.

FIG. 6 shows a bottom view of the swivel mount assembly 110. A circular gear 318 is rotatably coupled to the plate part 320 and mates with gear teeth 316 formed in part of the outer circumference of the lip part 314. The gear teeth 316 and the circular gear 318 combine to act as a damper on the rotation of the swivel mount assembly 110. Further, the gear teeth 316 are present only on part of the outer circumference of the lip part 314 to restrict the range of rotation of the swivel mount assembly 110.

FIGS. 7A-7C illustrates a cable retractor 150 for facilitating the withdrawal and retraction of a length of cable 780 according to an embodiment. To permit the incorporation of two or three cable retractors 150 within the space provided beneath the swivel mount assembly 110 shown in FIGS. 1A-1B and 2A-2B, the present embodiments provide cable retractors 150 that are thinner than cable retractors known in the art. For example, the cable retractors 150 are thinner than those described in U.S. Pat. Nos. 8,469,303, 8,469,304, and 8,469,305, each issued Jun. 25, 2013, U.S. Pat. No. 8,657,224, issued Feb. 25, 2014, U.S. Pat. No. 9,056,744, issued Jun. 16, 2015, and U.S. Pat. No. 9,475,673, issued Oct. 25, 2016, each to Feldstein, et al., the disclosures of which are incorporated herein by reference.

The cable retractor 150 provides a compartment to keep interface cables at the ready to be withdrawn and plugged into computers, AV sources, and a host of other devices. The cable retractor 150 provides for extensive connectivity in an easy pull out cable storage mechanism to support a wide range of applications and signal types. When the cable 780 is not in use, the cable 780 stows neatly within the cable retractor 150. Additionally, while cable 780 is in use, any excess of the cable 780 simply remains out-of-sight in the cable retractor 150.

The cable retractor 150 is mounted to an end portion 340 disposed at the end of the rotatable body 302 of the swivel mount assembly 110. One end of the cable retractor 150 is connected to end portion 340 using, for example, brackets, clips, screws, or like fasteners. In one embodiment, the cable retractor 150 is mounted vertically below the mounting structure, such as below a conference room table or a desk.

FIG. 7A is a partially exploded perspective view of the cable retractor 150. The cable retractor 150 includes a retractor frame 700. The retractor frame 700 includes first and second frame ends 702, 704. The retractor 150 stores, within the frame 700, an intermediate storage section 782 of the cable 780. The cable 780 may be a USB cable, Ethernet cable, 15-PIN VGA (plus audio combined) HDMI cable, DVI cable, CAT-5 cable, CAT-5E cable, CAT-6 cable, optical fiber, audio cable, display port or another type of cable.

The retractor frame 700 may be made of any material that can be molded, extruded or bent, for example, a metal such as aluminum or a polymer. Example of polymers include plastics such as thermoplastic, thermoset plastic, polyurethane, polyethylene, polypropylene and engineering plastic, for example, synthetic polymers including nylon.

The cable retractor 150 includes a single first pulley 720 and a single second pulley 740. The first pulley 720 rotates independently along a first axis 722. The second pulley 740 rotates independently along a second axis 742. Only a single first pulley 720 and a single second pulley 740 are provided, rather than the paired first pulleys and paired second pulleys present in known cable retractors, to provide a thinner profile that allows space for two or three such cable retractors to be coupled to the swivel mount assembly 110. To make up for the loss in cable length storage capacity resulting from the absence of paired pulleys, the length of the retractor frame 700 is roughly double the length of the frame of the known, paired-pulley cable retractors.

FIG. 7B illustrates the cable retractor 150 with a cover of the retractor frame 700 removed. The intermediate storage section 782 of the cable 780 is at least partially wound over the first and second pulleys 720, 740. A first end 784 of the cable is disposed outside of the retractor frame 700 and extends from a first opening 760 in the retractor frame 700 to a connector 792 that is typically hidden under the mounting structure. The first end 784 is typically also be held in place against the retractor frame 700 by a clip 764.

Within the retractor frame 700, a section of the intermediate storage section 782 of the cable 780 extends from the first opening 760 to the first pulley 720 and over the first pulley 720. Another section of the intermediate storage section 782 of the cable 780 extends from the first pulley 720 to, and over, the second pulley 740. A second (free) end 786 of the cable 780 extends from the second pulley 740 through a second opening 762 in the retractor frame 700 and outside the retractor frame 700.

The first and second pulleys 720, 740 are laterally spaced apart from each other with the first pulley 720 ordinarily being disposed at the first frame end 702 of the retractor frame 700, and the second pulley 740 being disposed at the second frame end 704 of the retractor frame 700. The first pulley 720 rotates on a first axis 722 and is rotatably mounted on a slideable block 712 that is disposed in the upper and lower laterally spaced tracks 710 for sliding motion between the first and second frame ends 702, 704. The second pulley 740 rotates along a second axis 722 which is located adjacent to the second frame end 704 of the retractor frame 700.

The retractor frame 700 includes peripheral first and second frame walls 706, 708 that form the laterally spaced tracks 710. The tracks 710 each have an elongated guide recess (not shown) that receive the slideable block 712. The slideable block 712 is slidably mounted in the tracks 710. The tracks 710 may be made of, or coated with, a low friction material, such as Teflon or the like.

In addition to being connected to the first pulley 720, the slideable block 712 is connected at one end to a spring 734 that is further wound around at least one of the first and second spring spools 730, 732. The spring 734 (in a normal or relaxed state) exerts a near continuous retraction force to urge the slideable block 712, along with the first pulley 720, away from the second pulley 740. The retraction force urges the slideable block 712 away from the second pulley 740 to a storage or retracted position.

The cable retractor 700 may include a dampening system (not shown) for preventing the cable 780 from whipping during retraction.

When a user desires to draw out a length of the cable 780, the user typically pulls on the second (free) end 786 of the cable 780. By the user exerting a force greater than the retraction force exerted by the spring 734, the pulling on the second (free) end 786 of the cable 780 urges the first pulley 720, along with the slideable block 712, longitudinally along the tracks 710 toward the second pulley 740.

As the free end 786 of the cable 780 is withdrawn, the first pulley 720 together with the slideable block 712 moves from a position shown in FIG. 7B toward a position shown in FIG. 7C. At the same time, the spring 734 is unwound from the first and second spring spools 730, 732 and exerts a force counter to the force exerted by the user. That is, a user pulling on the free end 786 of the stored cable 780 exerts a force on the first pulley 720 and draws the slideable block 712 and the first pulley 720 along the track 710 away from first and second spring spools 730, 732 and toward the fixed second pulley 740. This motion of the slideable block 712 and longitudinally first pulley 720 is resisted by continued elongation of the spring 734 from the spring spools 730, 732 during withdrawal of on the free end 786 of the stored cable 780

Should the user then release the free end 786 of the cable, the spring 734 ordinarily would draw the free end 786 of the cable 780, together with any portion of the intermediate storage section 782 of the cable 780 that was withdrawn from the retractor 150, back inside the retractor frame 700. Therefore, to prevent the withdrawn cable from being pulled back in and allowing its use, a staple catch 750 is provided on, for example, the slidable block 712, and a latch part 752 is provided, for example, adjacent to the second pulley 740. When the free end 786 of the cable 780 is fully withdrawn from the retractor body 700, the latch part 752 mates with the staple catch 750 and holds the slideable block 712 in the fully withdrawn position shown in FIG. 7C.

To release the staple catch 750 from the latch part 752, the user merely further pulls on the free end 786 of the cable 780. The latch part 752 is configured to release the staple catch 750 upon such force being exerted. The spring 734 then draws the sliding block 712, together with the first pulley 720, back toward the first end of the retractor body 700 to the position shown in FIG. 7B, and retracts the withdrawn part of the cable 780 back inside the retractor body 700.

FIG. 8A shows the rotatable docking station 100 in position to be inserted into an opening in a mounting structure 800. The mounting structure 800 may be a portion of the table top, desk top, or other structure. The opening may be a circular opening 802 into which the cylindrical-shaped insertable part 310 of the swivel mount assembly 110 may be inserted.

As described above, the rotatable docking station 100 includes the swivel mount assembly 110 and the retractors 150. Additionally, connectors 790 are provided at the respective free ends of the cables 780, and extend outward from the side wall apertures of the swivel mount assembly 110. The connectors 790 are in positions where any one of them may be pulled away from the swivel mount assembly 110, at the same time withdrawing a portion of the attached cable 780 from the corresponding cable retractor 150.

FIG. 8B shows the rotatable docking station 100 after insertion into the opening 802. The cable retractors 150, as well as the assembly body of the swivel mount assembly 110, are hidden below the mounting structure 800. Only the portion of the swivel mount assembly 110 that is from the lip part 304 to the platform part 330 remains above a first surface 804 of the mounting structure 800, with the lip part resting directly on the first surface 804.

The insertable part 310 of the swivel mount assembly 110 is secured to the mounting structure 800 using the threaded securing body 810, shown in FIG. 8A. Specifically, the securing body 810 is turned about the threads 312 of the insertable part 310 until the securing body 810 contacts the second surface 806 of the mounting body 800, causing the lip part 304 to press against the first surface 804 of the mounting structure 800 and securing the insertable part 310 of the swivel mount assembly 110 and the cable retractor in place. The rotatable body 302 of the swivel mount assembly 110, however, remains free to be rotated at least within the predetermined range of angles.

FIG. 8C shows the electronic device 820 that is to be supported by the rotatable docking station 100. According to an embodiment, the electronic device 820 is securable to the extensions 334 of the swivel mount assembly 110. Additionally, power and data cables (not shown) extending from the bottom of the electronic device 820 are fed through the platform part apertures 332 of the swivel mount assembly 110 to be hidden from view.

Figure 8E:
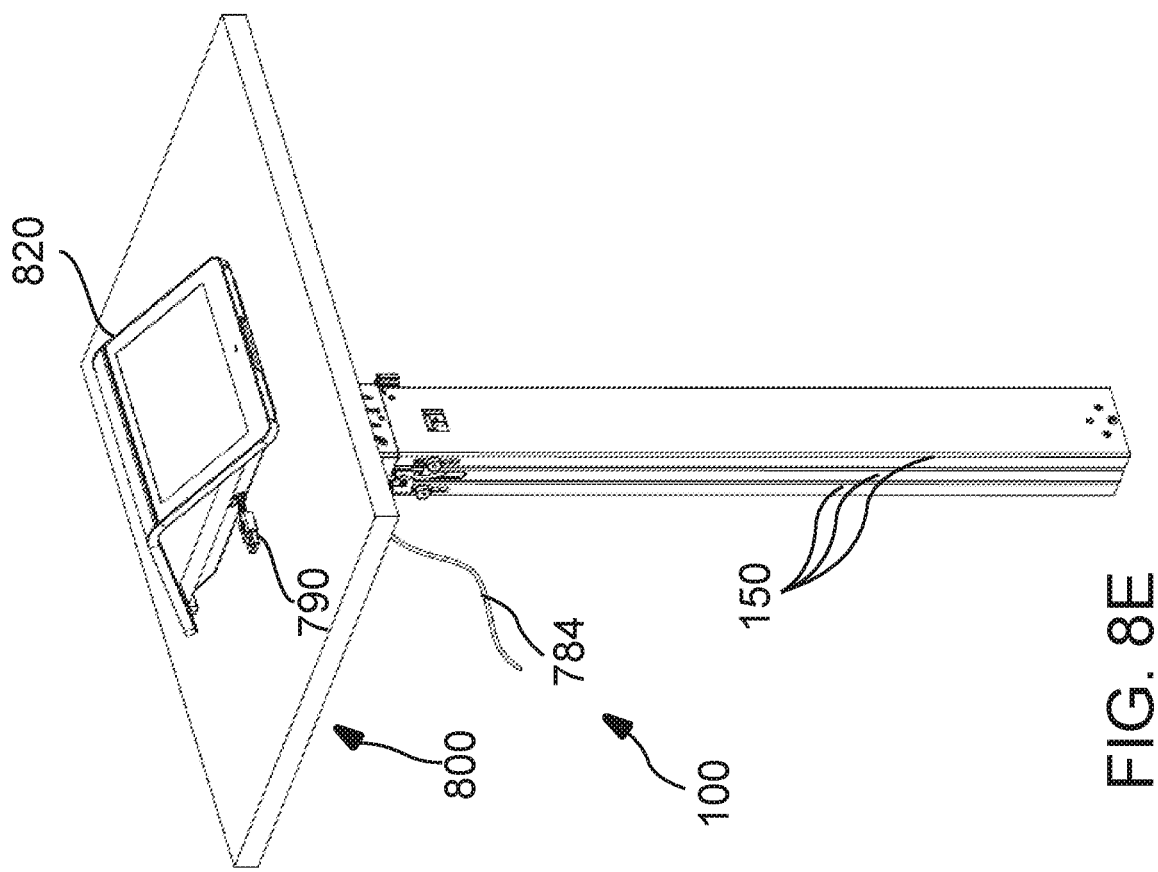

FIGS. 8D and 8E show the electronic device 820 mounted to the swivel mount assembly 110 with the cables extending from the electronic device 820 hidden from view.

FIG. 9 shows a cross-sectional view of the rotatable docking station 100 taken along line A-A of FIG. 8D. The cable retractor 150 is shown with the slideable block 712 and first pulley disposed at positions similar to that shown in FIG. 7B, except that the retractor frame 700 arranged vertically in its mounted position. FIG. 9 also shows the routing of the cable 782 through the cable retractor 150 and the swivel mount assembly 110. After exiting the cable retractor 150, the cable 782 passes over the first roller 328 and under the second roller 338, each located within the swivel mount assembly 110 as shown in FIG. 5B, before exiting through the sidewall aperture 324.

INDUSTRIAL APPLICABILITY

To solve the aforementioned problems, the present embodiments provide a rotatable docking station that includes a swivel mount assembly and one or more cable retractors.

ALTERNATE EMBODIMENTS

Alternate embodiments may be devised without departing from the spirit or the scope of the embodiments.

What is claimed is:

1. A rotatable docking station, comprising:
   (a) a swivel mount assembly for rotational mounting of an electronic device to a mounting structure, the swivel mount assembly comprising:
      (1) an assembly body, comprising:
         (A) an insertable part configured to be inserted into an opening in the mounting structure, the opening extending from a first surface of the mounting structure to an opposing second surface of the mounting structure, the insertable part having a shape that conforms to a shape of the opening,
         (B) a lip part attached to an end of the insertable part and being wider than the opening in the mounting structure such that the lip rests on the first surface upon the insertable part being inserted into the opening;
      (2) a securing body configured to secure the assembly body to the mounting structure; and
      (3) a rotatable body configured to be rotatable about an axis extending through the opening in the mounting structure, the rotatable body comprising:
         (A) another insertable part configured to be inserted into an opening in the insertable part of the assembly body,
         (B) a plate part attached to an end of the another insertable part such that the plate part is adjacent to the lip part of the assembly body upon the another insertable part being inserted into the opening in the assembly body, the plate part having at least one aperture formed therein,
         (C) a plurality of sidewalls each joined at one end to the plate part, at least one of the sidewalls having at least one side aperture formed therein, and
         (D) a platform part disposed at an opposing end of each of the plurality of sidewalls and being configured to support the electronic device, the platform part having at least one aperture formed therein, the at least one aperture in the plate part and the at least one aperture in the platform part being disposed at respective locations that permit a cable extending from the electronic device to pass through each; and
   (b) at least one cable retractor coupled to another end of the another insertable part of the rotatable body, and comprising:
      (1) a frame having first and second frame ends, opposing first and second frame walls disposed between the first and second frame ends, and a track extending along one of the first and second frame walls;
      (2) a slideable block configured to slide along the track:
      (3) a single first pulley coupled to the slideable block and rotatable about a first axis that moves together with the slidable block, the first pulley being the sole pulley that is rotatable about the first axis;
      (4) at least one spring spool mounted at the first frame end:
      (5) a spring having a coiled part wound around the at least one spring spool, and having a segment that extends away from the coiled part and is coupled to the slideable block; and
      (6) a single second pulley disposed at the second frame end and rotatable about a fixed second axis, the second pulley being the sole pulley that is rotatable about the second axis;
      (7) wherein
         (A) an intermediate storage section of a cable is ordinarily disposed within the frame, a first end of the intermediate storage section extending through a first opening located in one of the first and second frame walls, and a second end of the intermediate storage section extending through a second opening located at the second frame end,
         (B) the intermediate storage section of the cable extends from the first end of the intermediate storage section of the cable to the first pulley, then around the at least part of the first pulley, then from the first pulley to the second pulley, then around the at least part of the second pulley, and then from the second pulley to the second end of the intermediate storage section of the cable,
         (C) in response to the second end of the intermediate storage section of the cable being pulled away from the frame, the first pulley and the slideable block are urged away from the first frame end toward the second frame end thereby permitting a portion of the intermediate storage section of the cable to be withdrawn from the frame, the first pulley being the sole pulley being urged away from the first frame end.

2. A rotatable docking station, comprising:
   (a) a swivel mount assembly for rotational mounting of an electronic device to a mounting structure, the swivel mount assembly comprising:
      (1) an assembly body, comprising:
         (A) an insertable part configured to be inserted into an opening in the mounting structure, the opening extending from a first surface of the mounting structure to an opposing second surface of the mounting structure, the insertable part having a shape that conforms to a shape of the opening,
         (B) a lip part attached to an end of the insertable part and being wider than the opening in the mounting structure such that the lip rests on the first surface upon the insertable part being inserted into the opening;
      (2) a securing body configured to secure the assembly body to the mounting structure; and
      (3) a rotatable body configured to be rotatable about an axis extending through the opening in the mounting structure, the rotatable body comprising:
         (A) another insertable part configured to be inserted into an opening in the insertable part of the assembly body,
         (B) a plate part attached to an end of the another insertable part such that the plate part is adjacent to the lip part of the assembly body upon the another insertable part being inserted into the opening in the assembly body, the plate part having at least one aperture formed therein,
         (C) a plurality of sidewalls each joined at one end to the plate part, at least one of the sidewalls having at least one side aperture formed therein, and
         (D) a platform part disposed at an opposing end of each of the plurality of sidewalls and being configured to support the electronic device, the platform part having at least one aperture formed therein, the at least one aperture in the plate part and the at least one aperture in the platform part being disposed at respective locations that permit a cable extending from the electronic device to pass through each; and (b) at least one cable retractor coupled to another end of the another insertable part of the rotatable body, and comprising:

(1) a frame having first and second frame ends, opposing first and second frame walls disposed between the first and second frame ends, and a track extending along one of the first and second frame walls:

(2) a slideable block configured to slide along the track:

(3) a single first pulley coupled to the slideable block and rotatable about a first axis that moves together with the slidable block, the first pulley being the sole pulley that is rotatable about the first axis:

(4) at least one spring spool mounted at the first frame end;

(5) a spring having a coiled part wound around the at least one spring spool, and having a segment that extends away from the coiled part and is coupled to the slideable block; and (6) a single second pulley disposed at the second frame end and rotatable about a fixed second axis, the second pulley being the sole pully that is rotatable about the second axis:

(7) wherein (A) an intermediate storage section of a cable is ordinarily disposed within the frame, a first end of the intermediate storage section extending through a first opening located in one of the first and second frame walls, and a second end of the intermediate storage section extending through a second opening located at the second frame end, (B) the intermediate storage section of the cable extends from the first end of the intermediate storage section of the cable to the first pulley, then around the at least part of the first pulley, then from the first pulley to the second pulley, then around the at least part of the second pulley, and then from the second pulley to the second end of the intermediate storage section of the cable, (C) in response to the second end of the intermediate storage section of the cable being pulled away from the frame, the first pulley and the slideable block are urged away from the first frame end toward the second frame end thereby permitting a portion of the intermediate storage section of the cable to be withdrawn from the frame, the first pulley being the sole pulley being urged away from the first frame end, and (D) the at least one spring spool comprises (i) first and second spring spools each mounted at the first frame end, wherein (ii) a first coiled part of the spring is wound around the first spring spool, a second coiled part of the spring is wound around the second spring spool, and an intermediate segment of the spring connects the first and second coiled parts and is coupled to the slideable block.

3. A cable retractor, comprising:

(a) a frame having first and second frame ends, opposing first and second frame walls disposed between the first and second frame ends, and a track extending along one of the first and second frame walls;

(b) a slideable block configured to slide along the track;

(c) a single first pulley coupled to the slideable block and rotatable about a first axis that moves together with the slidable block, the first pulley being the sole pulley that is rotatable about the first axis;

(d) at least one spring spool mounted at the first frame end;

(e) a spring having a coiled part wound around the at least one spring spool, and having a segment that extends away from the coiled part and is coupled to the slideable block; and (f) a single second pulley disposed at the second frame end and rotatable about a fixed second axis, the second pulley being the sole pulley that is rotatable about the second axis;

(g) wherein (1) an intermediate storage section of a cable is ordinarily disposed within the frame, a first end of the intermediate storage section extending through a first opening located in one of the first and second frame walls, and a second end of the intermediate storage section extending through a second opening located at the second frame end, (2) the intermediate storage section of the cable extends from the first end of the intermediate storage section of the cable to the first pulley, then around the at least part of the first pulley, then from the first pulley to the second pulley, then around the at least part of the second pulley, and then from the second pulley to the second end of the intermediate storage section of the cable, (3) a second end of the intermediate storage section extends through a second opening located at the second frame end, (4) in response to the second end of the intermediate storage section of the cable being pulled away from the frame, the first pulley and the slideable block are urged away from the first frame end toward the second frame end thereby permitting a portion of the intermediate storage section of the cable to be withdrawn from the frame, the first pulley being the sole pulley being urged away from the first frame end, (5) the at least one spring spool further comprises (A) first and second spring spools each mounted at the first frame end, wherein (B) a first coiled part of the spring is wound around the first spring spool, a second coiled part of the spring is wound around the second spring spool, and an intermediate segment of the spring connects the first and second coiled parts and is coupled to the slideable block, (6) the spring exerts a nearly constant retraction force on the slideable block such that, in response to the second end of the intermediate storage section of the cable being at least partly pulled away from the frame and then released, the spring pulls the slideable block and the first pulley back toward the first frame end and retracts the withdrawn portion of the intermediate storage section of the cable back toward the frame, the first pulley being the sole pulley pulled back toward the first frame end, (7) the cable retractor further comprises (A) a staple catch disposed at one of (i) the slideable block or (ii) the frame at the second frame end, and (B) a latch part disposed at another of (i) the slideable block or (ii) the frame at the second frame end, (C) in response to the second end of the intermediate storage section of the cable being pulled away from the frame, the slideable block is drawn to the second frame end until the latch part engages the staple catch and prevents the spring from pulling the slideable block and the first pulley back toward the first frame end, and (D) in response to the latch part releasing the staple catch, the spring pulls the slideable block and the first pulley back toward the first frame end and retracts the withdrawn portion of the intermediate storage section of the cable back toward the frame, the first pulley being the sole pulley pulled back toward the first frame end.

4. A rotatable docking station, comprising:

(a) a swivel mount assembly for rotational mounting of an electronic device to a mounting structure, the swivel mount assembly comprising:

(1) an assembly body, comprising:

(A) an insertable part configured to be inserted into an opening in the mounting structure, the opening extending from a first surface of the mounting structure to an opposing second surface of the mounting structure, the insertable part having a shape that conforms to a shape of the opening, (B) a lip part attached to an end of the insertable part and being wider than the opening in the mounting structure such that the lip rests on the first surface upon the insertable part being inserted into the opening;

(2) a securing body configured to secure the assembly body to the mounting structure; and (3) a rotatable body configured to be rotatable about an axis extending through the opening in the mounting structure, the rotatable body comprising:

(A) another insertable part configured to be inserted into an opening in the insertable part of the assembly body, (B) a plate part attached to an end of the another insertable part such that the plate part is adjacent to the lip part of the assembly body upon the another insertable part being inserted into the opening in the assembly body, the plate part having at least one aperture formed therein, (C) a plurality of sidewalls each joined at one end to the plate part, at least one of the sidewalls having at least one side aperture formed therein, and (D) a platform part disposed at an opposing end of each of the plurality of sidewalls and being configured to support the electronic device, the platform part having at least one aperture formed therein, the at least one aperture in the plate part and the at least one aperture in the platform part being disposed at respective locations that permit a cable extending from the electronic device to pass through each; and (b) at least one cable retractor of claim 3 coupled to another end of the another insertable part of the rotatable body.

* * * * *